United States Patent
Lu et al.

(10) Patent No.: US 7,764,086 B2
(45) Date of Patent: Jul. 27, 2010

(54) BUFFER CIRCUIT

(75) Inventors: Hung Wen Lu, Hsinchu (TW); Chauchin Su, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 2 days.

(21) Appl. No.: 11/853,003

(22) Filed: Sep. 10, 2007

(65) Prior Publication Data
US 2008/0150583 A1 Jun. 26, 2008

Related U.S. Application Data

(60) Provisional application No. 60/876,830, filed on Dec. 22, 2006.

(51) Int. Cl.
*H03K 19/0175* (2006.01)
*H03K 3/00* (2006.01)
*H03K 3/289* (2006.01)

(52) U.S. Cl. .......................... 326/82; 327/202; 327/203; 327/218; 327/222

(58) Field of Classification Search ............. 326/82–83, 326/86–87, 107–108; 327/202–203, 210–212, 327/215, 218, 219, 222, 333
See application file for complete search history.

(56) References Cited

U.S. PATENT DOCUMENTS

| | | | | | |
|---|---|---|---|---|---|
| 4,939,384 | A | * | 7/1990 | Shikata et al. | 327/212 |
| 5,105,100 | A | * | 4/1992 | Yamada | 327/202 |
| 5,140,179 | A | * | 8/1992 | Takano | 327/203 |
| 5,173,870 | A | * | 12/1992 | Sukashita et al. | 708/625 |
| 5,281,865 | A | * | 1/1994 | Yamashita et al. | 327/208 |
| 5,508,648 | A | * | 4/1996 | Banik | 327/203 |
| 5,552,738 | A | * | 9/1996 | Ko | 327/203 |
| 5,570,051 | A | * | 10/1996 | Chiang et al. | 327/203 |
| 5,650,735 | A | * | 7/1997 | Ko | 326/93 |
| 5,654,658 | A | * | 8/1997 | Kubota et al. | 327/202 |
| 5,751,174 | A | * | 5/1998 | Kuo et al. | 327/199 |
| 5,751,176 | A | * | 5/1998 | Sohn et al. | 327/295 |
| 5,767,716 | A | * | 6/1998 | Ko | 327/203 |
| 5,942,916 | A | * | 8/1999 | Matsbara et al. | 326/83 |
| 5,973,955 | A | * | 10/1999 | Nogle et al. | 365/154 |
| 5,982,211 | A | * | 11/1999 | Ko | 327/202 |
| 6,087,872 | A | * | 7/2000 | Partovi et al. | 327/201 |
| 6,150,861 | A | * | 11/2000 | Matsunaga et al. | 327/203 |

(Continued)

*Primary Examiner*—James H. Cho
*Assistant Examiner*—Matthew C Tabler
(74) *Attorney, Agent, or Firm*—Alston & Bird LLP

(57) ABSTRACT

A buffer circuit having an input terminal and an output terminal comprises a first inverter having an input node coupled to the input terminal and an output node coupled to the output terminal, a second inverter having an input node coupled to a reference voltage and an output node, a third inverter having an input node coupled to the output terminal and an output node coupled to the output node of the second inverter, a fourth inverter having an input node coupled to the output node of the second inverter and an output node coupled to the output terminal, a fifth inverter having an input node and an output node coupled to the output terminal, a sixth inverter having an input node and an output node coupled to the output node of the second inverter, a first resistive element is coupled between the output terminal and the input node of the fifth inverter, and a second resistive element is coupled between the output node of the second inverter and the input node of the sixth inverter.

24 Claims, 6 Drawing Sheets

U.S. PATENT DOCUMENTS

| | | | |
|---|---|---|---|
| 6,239,639 B1 * | 5/2001 | Yaoi et al. | 327/202 |
| 6,239,640 B1 * | 5/2001 | Liao et al. | 327/218 |
| 6,424,196 B2 * | 7/2002 | Pomet | 327/218 |
| 6,445,235 B1 * | 9/2002 | Sachdev | 327/202 |
| 6,483,347 B1 * | 11/2002 | Baker | 326/82 |
| 6,518,810 B1 * | 2/2003 | Takahashi | 327/202 |
| 6,538,473 B2 * | 3/2003 | Baker | 326/82 |
| 6,563,356 B2 * | 5/2003 | Fulkerson | 327/203 |
| 6,683,475 B2 * | 1/2004 | Baker | 326/83 |
| 6,720,813 B1 * | 4/2004 | Yee et al. | 327/218 |
| 6,762,637 B2 * | 7/2004 | Raychaudhuri | 327/202 |
| 6,850,105 B1 * | 2/2005 | Rishin | 327/202 |
| 6,864,732 B2 * | 3/2005 | Chalasani | 327/203 |
| 6,909,314 B2 * | 6/2005 | Ahn | 327/202 |
| 7,038,520 B2 * | 5/2006 | Chiba et al. | 327/333 |
| 7,132,870 B2 * | 11/2006 | Linam et al. | 327/202 |
| 7,183,825 B2 * | 2/2007 | Padhye et al. | 327/202 |
| 7,221,205 B2 * | 5/2007 | Kinkade et al. | 327/203 |
| 7,237,164 B1 * | 6/2007 | Katchmart | 714/726 |
| 7,315,191 B2 * | 1/2008 | Branch et al. | 327/203 |
| 7,504,867 B2 * | 3/2009 | Choi et al. | 327/108 |
| 7,535,259 B2 * | 5/2009 | Osame et al. | 326/104 |
| 7,616,040 B2 * | 11/2009 | Motomura | 327/202 |
| 7,616,041 B2 * | 11/2009 | Frederick et al. | 327/202 |
| 2001/0004220 A1 * | 6/2001 | Pomet | 327/203 |
| 2002/0000858 A1 * | 1/2002 | Lu | 327/202 |
| 2002/0093368 A1 * | 7/2002 | Fulkerson | 327/203 |
| 2002/0180503 A1 * | 12/2002 | Lu | 327/203 |
| 2004/0032290 A1 * | 2/2004 | Lundberg | 327/202 |
| 2004/0075479 A1 * | 4/2004 | Gupta | 327/202 |
| 2004/0090256 A1 * | 5/2004 | Cho | 327/202 |
| 2004/0095175 A1 * | 5/2004 | Chalasani | 327/202 |
| 2004/0150449 A1 * | 8/2004 | Durham et al. | 327/202 |
| 2004/0257136 A1 * | 12/2004 | Osame et al. | 327/219 |

* cited by examiner

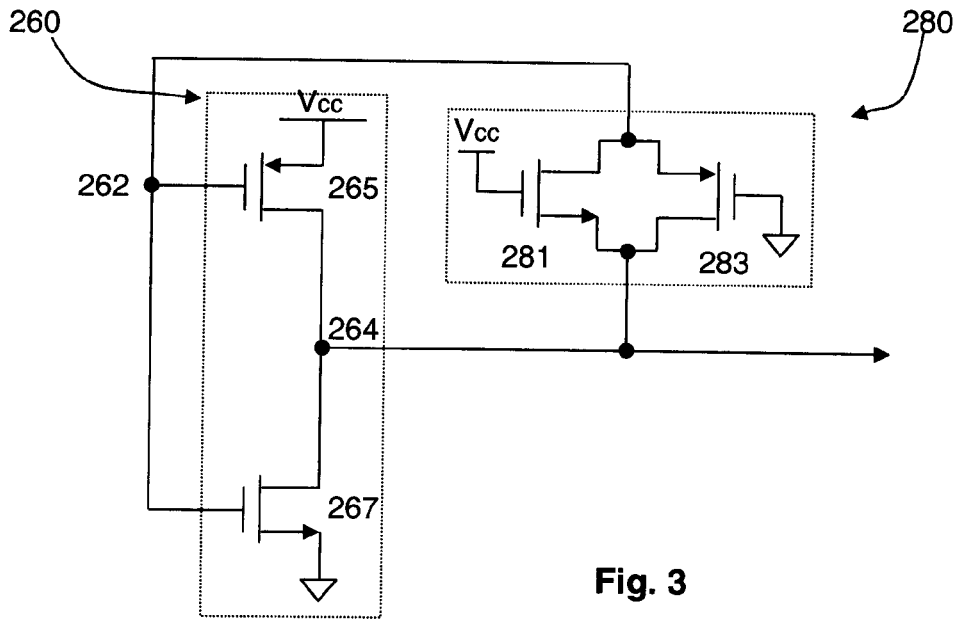
Fig. 3
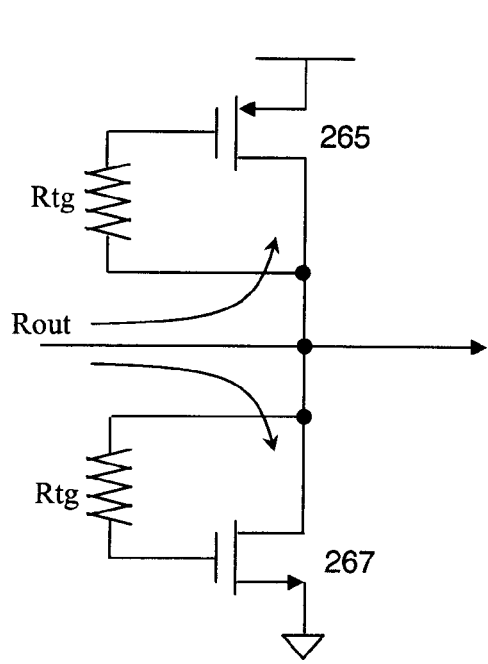
Fig. 4A
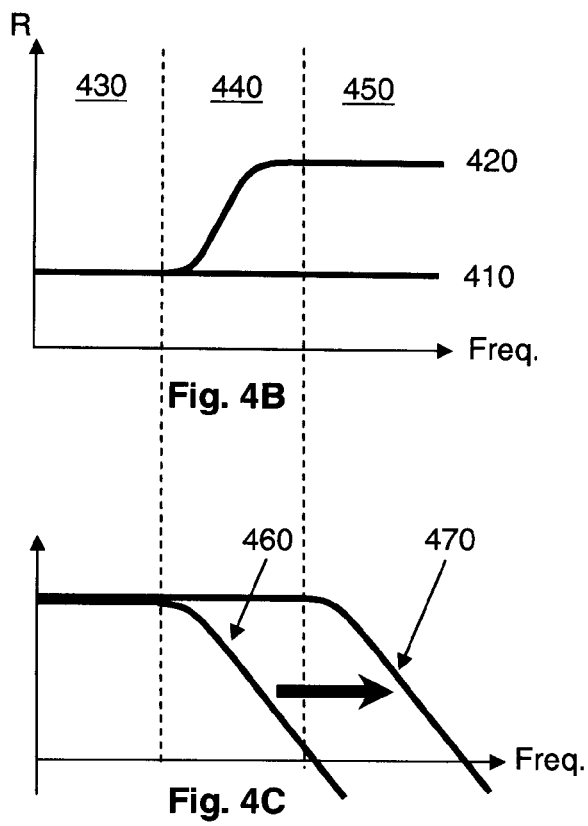
Fig. 4B
Fig. 4C

BUFFER CIRCUIT

BACKGROUND OF THE INVENTION

1. Field of the Invention

This invention relates to a buffer circuit, and more particularly, to a buffer circuit that may be used in digital devices or systems.

2. Background of the Invention

Buffers are commonly used in data transmission systems. For example, a signal buffer circuit may be used at an input interface to receive or amplify signals, enhance signal driving capability, and/or reduce signal transition time.

Buffer circuits are usually designed using analog circuits. An example of an analog buffer circuit may include a differential pair with various passive elements, including inductors, capacitors and resistors. FIG. 1A shows an analog buffer circuit 100A for Pseudo Emitter Coupled Logic (PECL). The PECL buffer 100A of FIG. 1A has input terminals 102 and 112, which receive separate PECL signals that are complementary to each other. The input terminal 102 is connected to the gate of an NMOS transistor 106, which is coupled to a PMOS transistor 104 having its gate coupled to ground. The input terminal 112 is connected to the gate of an NMOS transistor 116, which is coupled to a PMOS transistor 114 having its gate coupled to ground. The PMOS transistors 104 and 114 have their sources connected to a power supply $V_{dd}$ (e.g., +4 volts). The drain of the PMOS transistor 104 is connected to the drain of the NMOS 106, and the drain of the PMOS transistor 114 is connected to the drain of the NMOS transistor 116. The sources of the NMOS transistors 106 and 116 are connected to the NMOS transistor 130 which may provide a constant current. The drain of the PMOS transistor 104 is connected to an output terminal 140 via an NMOS transistor 108 which serves as a level shifter. The drain of the PMOS transistor 114 is connected to an output terminal 150 via an NMOS transistor 118 which serves as a level shifter. Similar to the NMOS transistor 130, the NMOS transistors 132 and 134 serve as a current source to provide constant current sources. The PECL buffer 100A constitutes a current switching differential buffer circuit. Such a circuit may also be designed to reduce signal swing and optimize signal differential, thus improving the operating bandwidth and noise tolerance. A feedback circuit to compensate certain parameters, such as bias, bandwidth and gain, may be employed to prevent process drift from affecting product yield.

Although an analog buffer circuit may provide high efficiency in certain applications, such circuit has complicated designs, consumes more power, and requires large circuit areas. Thus, some systems use digital circuits instead to reduce power consumption and circuit area. However, digital circuits may suffer from poor noise tolerance. In addition, when digital circuits operate in high frequency, the resulting switching noise may decrease the system efficiency.

FIG. 1B shows a digital buffer disclosed in U.S. Pat. No. 6,483,347. The buffer circuit 100B of FIG. 1B may include eight inverters arranged as illustrated. The inverters 12 and 22 form a differential inverter pair. The inverters 40 and 50 constitute self bias circuit. The inverters 60 and 70 form a common mode noise-rejection circuit.

BRIEF SUMMARY OF THE INVENTION

One example consistent with the invention provides a buffer circuit having an input terminal and an output terminal, which comprises a first inverter having an input node coupled to the input terminal and an output node coupled to the output terminal, a second inverter having an input node coupled to a reference voltage and an output node, a third inverter having an input node coupled to the output terminal and an output node coupled to the output node of the second inverter, a fourth inverter having an input node coupled to the output node of the second inverter and an output node coupled to the output terminal, a fifth inverter having an input node and an output node coupled to the output terminal, a six inverter having an input node and an output node coupled to the output node of the second inverter, a first resistive element is coupled between the output terminal and the input node of the fifth inverter, and a second resistive element is coupled between the output node of the second inverter and the input node of the sixth inverter.

In another example, a buffer circuit comprises a first inverter having an input node coupled to a first input terminal and an output node coupled to a first output terminal, a second inverter having an input node coupled to a second input terminal and an output node coupled to a second output terminal, a third inverter having an input node coupled to the first output terminal and an output node coupled to the second output terminal, a fourth inverter having an input node coupled to the second output terminal and an output node coupled to the first output terminal, a fifth inverter having an input node and an output node coupled to the first output terminal, a sixth inverter having an input node and an output node coupled to the second output terminal, a first resistive element is coupled between the first output terminal and the input node of the fifth inverter and a second resistive element is coupled between the second output terminal and the input node of the sixth inverter.

Another example consistent with the invention provides a method of operating a buffer circuit with at least one buffer interface stage. The method comprises the steps of providing input signals to a differential pair, generating amplified signals from the input signals by the differential pair, filtering noises in the input signals by a noise reduction circuit, and controlling bandwidth distributions of the amplified signals by a bandwidth control circuit.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings:

FIG. 3 is a schematic diagram of an exemplary bandwidth control circuit in examples consistent with the present invention;

FIG. 4A illustrates an example of an equivalent circuit of the circuit of FIG. 3;

FIG. 4B is a chart illustrating the output resistance of a bandwidth control circuit in a buffer circuit in examples consistent with the present invention;

FIG. 4C is a chart illustrating the bandwidth of a buffer circuit in examples consistent with the present invention;

DETAILED DESCRIPTION OF THE INVENTION

Figure 2:
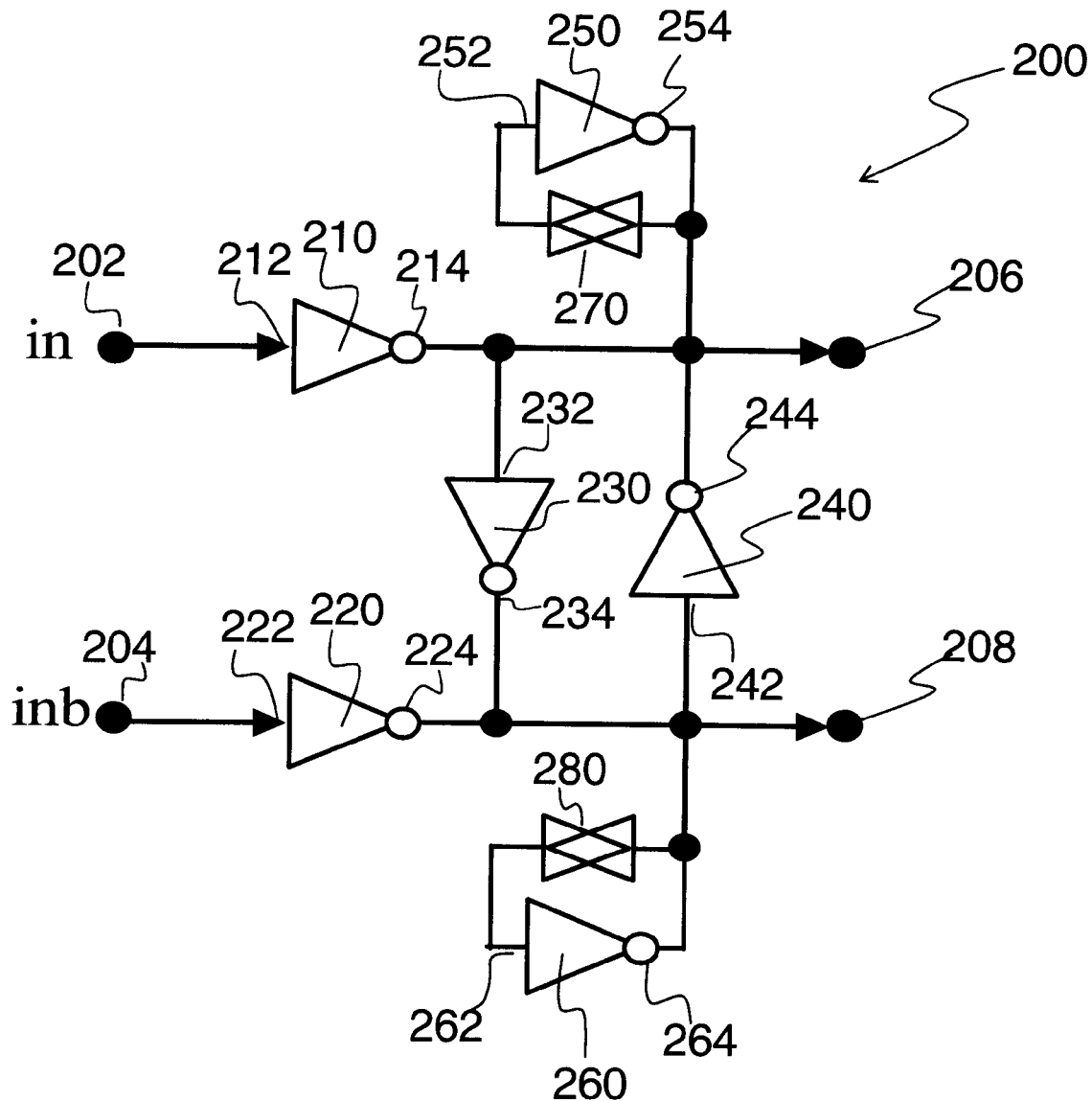
FIG. 2 is a buffer circuit in examples consistent with the present invention.

FIG. 2 illustrates an exemplary circuit diagram of a buffer circuit 200 in examples consistent with the present invention. The buffer circuit may have a first input terminal 202, a second input terminal 204, a first output terminal 206 and a second output terminal 208. The first input terminal 202 may be coupled to an input signal $V_{in}$. The first output terminal 206 may provide an output signal $V_{out}$. The second input terminal 204 may be coupled to a complementary input signal $V_{in}$*, in which case the terminal 208 is used as a complementary output terminal to provide a complementary output signal $V_{out}$*. Alternatively, the second input terminal 204 may be coupled to a reference voltage $V_{ref}$, in which case the output at the terminal 208 is usually not used.

Referring to FIG. 2, the buffer circuit 200 includes a differential pair which receives input signals and generates amplified signals from the input signals. The differential pair may enhance signal driving capability as well as improving signal slew rate. In one example consistent with the present invention, the differential pair may include a first inverter 210 and a second inverter 220. The first inverter 210 has an input node 212 coupled to the input terminal 202 of the buffer circuit 200 to receive an input signal $V_{in}$. The first inverter 210 has an output node 214 coupled to the output terminal 206 of the buffer circuit 200 to provide an output signal $V_{out}$. Similarly, a second inverter 220 has an input node 222 and an output node 224. The input node 222 of the second inverter 220 is coupled to the terminal 204 of the buffer circuit 200. The output node 224 of the second inverter 220 is coupled to the second output terminal 208 if a complementary input signal $V_{in}$* applies to the terminal 204, or to the first output terminal 206 if a reference voltage $V_{ref}$ applies to the terminal 204.

Referring to FIG. 2, the buffer circuit 200 also includes a noise reduction circuit coupled to the differential pair to filter noises in the input signals. The noise reduction circuit may include a third inverter 230 and a fourth inverter 240. The third inverter 230 has an input node 232 and an output node 234. The input node 232 of the third inverter 230 is coupled to the output node 214 of the first inverter 210. The output node 234 of the third inverter 230 is coupled to the output node 224 of the second inverter 220. Similarly, a fourth inverter 240 has an input node 242 and an output node 244. The input node 242 of the fourth inverter 240 is coupled to the output node 224 of the second inverter 220 while the output node 244 is coupled to the output node 214 of the first inverter 210. In the noise reduction circuit, the positive output signal $V_{out}$ is applied to the inverter 230 which in turn provides the negative output signal $V_{out}$*. In addition, the negative output signal $V_{out}$* is applied to the inverter 240 which in turn provides the positive output signal $V_{out}$. As a result, hysteresis phenomena occur in the buffer circuit 200. In this regard, the noise reduction circuit having the inverters 230 and 240 provides a differential mode voltage offset at the input terminals 202 and 204. Thus, the differential voltage between the input signals $V_{in}$ and $V_{in}$* (or $V_{ref}$) must overcome the voltage offset in order to change the state of the buffer circuit 200, thereby providing good common mode rejection and reducing the input common mode noise.

Referring to FIG. 2 again, the buffer circuit 200 further includes a bandwidth control circuit coupled to the differential pair and the noise reduction circuit. The bandwidth control circuit may operate for controlling bandwidth distributions of the amplified signals. In one example consistent with the present invention, the bandwidth control circuit of the buffer circuit 200 may include a fifth inverter 250 and a sixth inverter 260 each having its input node and its output node respectively coupled to the two ends of a resistive element. For example, the input node 252 of the fifth inverter 250 is coupled to one of the two terminals of a transmission gate 270. The other terminal of the transmission gate 270 and the output node 254 of the fifth inverter 250 are both coupled to the output node 214 of the first inverter 210. Similarly, the input node 262 is coupled to one of the two terminals of a transmission gate 280. The other terminal of the transmission gate 280 and the output node 264 of the sixth inverter 260 are both coupled to the output node 224 of the second inverter 220. Depending on the design and/or the application of the buffer circuit 200, different resistive elements may be used to be coupled with the inventers 250 and 260. Examples of the resistive elements may include transmission gates, MOS transistors, resistors, etc.

FIG. 3 illustrates an exemplary circuitry of an inverter having its two terminals coupled to a resistive element, such as inverter 260 and transmission gate 280. Referring to FIG. 3, the inverter 260 may include a PMOS transistor 265 with its source coupled to a supply voltage $V_{cc}$, its gate serving as the input node 262 coupled to one of the terminals of the transmission gate 280, and its drain serving as the output node 264 to coupled to the other terminal of the transmission gate 280 and the output node 224 of the second inverter 220. The inverter 260 may also include an NMOS transistor 267 having its source coupled to ground, its drain coupled to the drain of the PMOS transistor 265, and its gate coupled to the gate of the PMOS transistor 265. The transmission gates 270 and 280 may be a switch device, which in one example may include a parallel combination of an NMOS transistor 281 and a PMOS transistor 283 as shown at FIG. 3. The gate of the NMOS transistor 281 may be coupled to the power supply $V_{cc}$ and the gate of the PMOS transistor 283 may be coupled to ground. The source of the NMOS transistor 281 is connected to the drain of the PMOS transistor 283 as well as the output node 264 of the inverter 260. The drain of the NMOS transistor 281 is connected to the source of the PMOS transistor 283 as well as the input node 262 of the inverter 260. Note that the inverter 260 may be any presently known or hereinafter developed inverters, and the transmission gates 270 and 280 may be replaced by any types of resistive elements, such as MOS transistors and resistors.

Figure 1A:
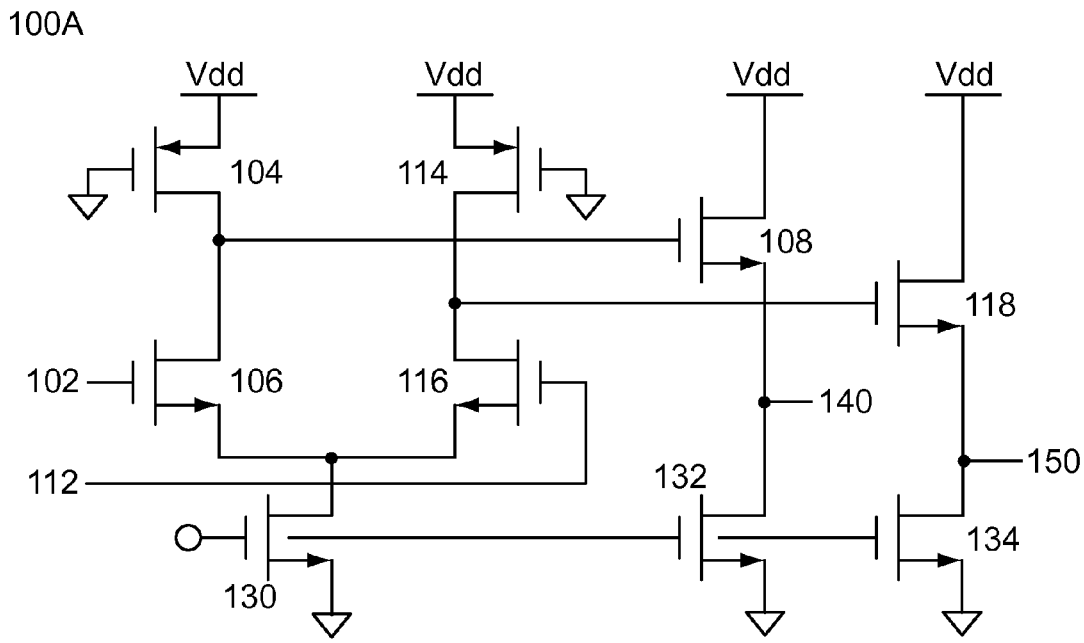
FIGS. 1A and 1B are examples of conventional buffer circuits.
Figure 1B:
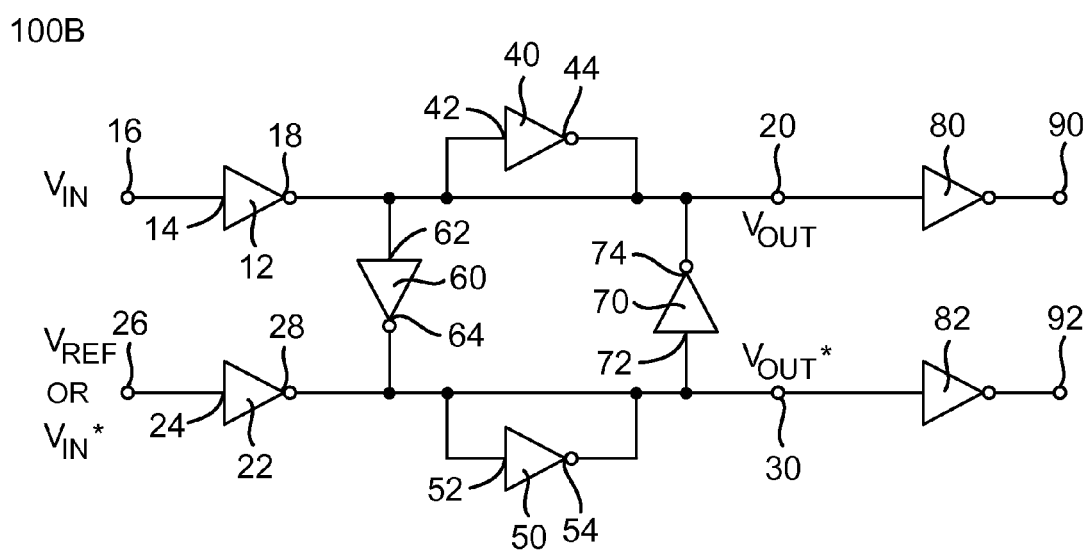

In one example, the bandwidth control circuit having inverters 250 and 260 and the transmission gates 270 and 280 may establish common mode level and/or increase signal bandwidth. FIG. 4A shows an equivalent circuit of an exemplary circuit with the inverter 260 and the transmission gate 280. In one example, the transmission gate 280 constitutes a resistor with resistance value $R_{tg}$ coupled between the gate and drain terminals of the PMOS transistor 265. The same resistor with resistance value $R_{tg}$ also coupled between the gate and drain terminals of the NMOS transistor 267. FIG. 4B is a chart comparing output resistance of a self bias circuit of FIG. 1B with the bandwidth control circuit of a buffer circuit of FIG. 2. With reference to FIG. 4B, 410 shows output resistance of a self bias circuit including only an inverter (as shown at FIG. 1B) without a transmission gate or resistive element coupled to the inverter. Since an inverter functions as a diode with flat frequency response, the output resistance of such a self bias circuit remains at the level of 1/gm throughout change of frequency. 420 shows output resistance of a circuit of FIG. 3 with a transmission gate or resistive element. When the buffer circuit 200 operates in low frequency 430, the output resistance may remain 1/gm. When the buffer circuit 200 operates in high frequency 450, the output resistance may be equal to the resistance value ($R_{tg}$) of the transmission gate. That is, for the circuit of FIG. 3, when the resistance value of the transmission gates is over 1/gm, the output resistance becomes larger with the increase of frequency from low to high. The transmission gates may serve as inductance load when the operating frequency falls in 440. The generated inductance load may offset the dominant pole of the circuit 200. As a result, the signal bandwidth may be increased. FIG. 4C is a chart comparing bandwidth of a buffer circuit of FIG. 1B with that of a buffer circuit of FIG. 2. 460 shows the gain margin of the buffer circuit of FIG. 1B where the self bias circuit includes only an inverter. 470 shows the gain margin of the buffer circuit of FIG. 2 where the bandwidth control circuit includes an invert and a transmission gate. As illustrated in FIG. 4C, the bandwidth of the buffer circuit of FIG. 2 is increased comparing to that of the buffer circuit of FIG. 1B.

Figure 5A:
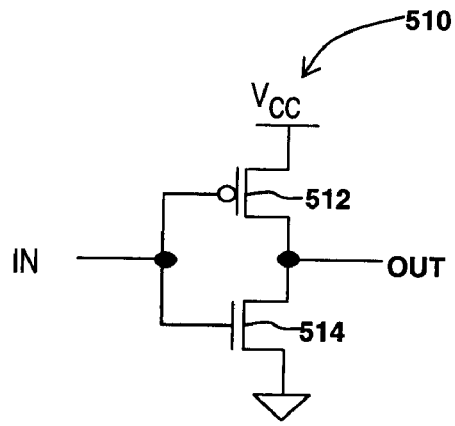
FIGS. 5A-E are schematics of exemplary inverters that may be used in a buffer circuit in examples consistent with the present invention.

The inverters 210, 220, 230, 240, 250 and 260 may be any presently known or hereinafter developed inverters, including inverting amplifiers and the inverters shown in FIGS. 5A-E. FIG. 5A shows an exemplary inverter 510 that includes a PMOS transistor 512 with its source coupled to a supply voltage $V_{cc}$, a gate serving as an input node to receive an input signal IN, and a drain serving as an output node to provide an output signal OUT. The inverter 510 also includes an NMOS transistor 514 having a source coupled to ground, a drain coupled to the drain of the PMOS transistor 512, and a gate coupled to the gate of the PMOS transistor 512. When the input signal IN is high, the NMOS transistor 514 is turned on to connect the output node to ground, thereby making the output signal OUT low. When the input signal IN is low, the PMOS transistor 512 is turned on to connect the output mode to $V_{cc}$, thereby making the output signal OUT high.

Figure 5B:
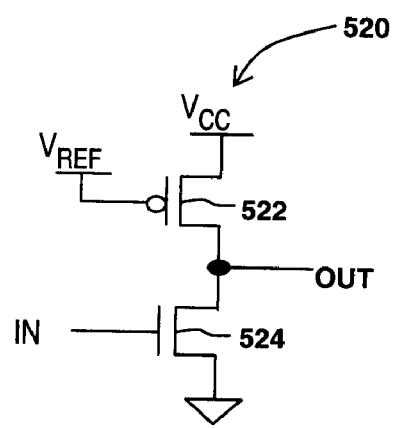

FIG. 5B shows another exemplary inverter 520 that includes a PMOS transistor 522 with its source coupled to a supply voltage $V_{cc}$, a gate coupled to a reference voltage $V_{ref}$, and a drain serving as the output node to provide an output signal OUT. The magnitude of the reference voltage is set to a level to keep the PMOS transistor 522 always in an on condition. The inverter 520 also includes an NMOS transistor 524 having a source coupled to ground, a drain coupled to the drain of the PMOS transistor 522, and a gate serving as an input node to receive an input signal IN. When the input signal IN is high, the NMOS transistor 524 is turned on to connect the output node to ground despite the PMOS transistor 522 being on. Thus, the output signal OUT is low. When the input signal IN is low, the NMOS transistor 524 is turned off, thereby allowing the output node to connect to $V_{cc}$ via the PMOS transistor 522 and making the output signal OUT high.

Figure 5C:
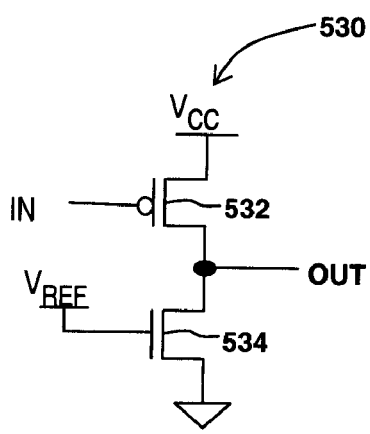

In another exemplary inverter 530 shown at FIG. 5C, a PMOS transistor 532 has its source coupled to a supply voltage $V_{cc}$, a gate serving as an input node to receive an input signal IN, and a drain serving as the output node to provide an output signal OUT. The inverter 530 also includes an NMOS transistor 534 having a source coupled to ground, a drain coupled to the drain of the PMOS transistor 532, and a gate coupled to a reference voltage $V_{ref}$ which is set to a level to keep the NMOS transistor 534 always in an on condition. When the input signal IN is high, the PMOS transistor 532 is turned off, thereby allowing the output node to be coupled to ground via the NMOS transistor 534. When the input signal IN is low, the PMOS transistor 532 is turned on, thereby coupling the output node to $V_{cc}$ despite the NMOS transistor 534 being on.

Figure 5D:
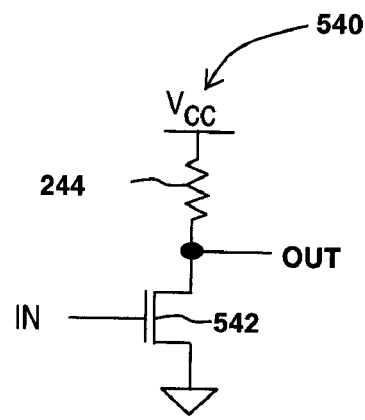

FIG. 5D shows another exemplary inverter 540 that includes an NMOS transistor 542 with its source coupled to ground, a gate serving as an input node to receive an input signal IN, and a drain serving as an output node by providing an output signal OUT. The inverter 540 further includes a resistor 544 coupled between a supply voltage $V_{cc}$ and the output node of the inverter 540. The operation of the inverter 540 is the same as the inverter 520 because the resistor 544 performs the same function as the PMOS transistor 522 of the inverter 520.

Figure 5E:
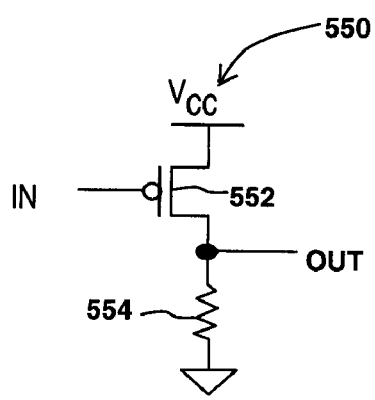

FIG. 5E shows an inverter 550 that includes a PMOS transistor 552 with its source coupled to $V_{cc}$, a gate serving as input node to receive an input signal IN, and a drain serving as an output node by providing an output signal OUT. The inverter 550 further includes a resistor 554 coupled between ground and the output node of the inverter 550. The operation of the inverter 550 is the same as the inverter 530 because the resistor 554 performs the same function as the NMOS transistor 534 of the inverter 530.

One example consistent with the invention provides a method of operating a buffer circuit with at least one buffer interface stage. In the exemplary method, the first step may include applying input signals to a differential pair, which in turn generates amplified signals from the input signals in the second step. One example of the differential pair may include inverters 210 and 220 as shown at FIG. 2. The noises in the signals are filtered by a noise reduction circuit in a following step. One example of the noise reduction circuit may include inverters 230 and 240 at shown at FIG. 2. Another step in the exemplary method may include the step of controlling bandwidth distributions of the amplified signals by a bandwidth control circuit. One example of the bandwidth control circuit may include inverters 250 and 260 as well as resistive elements 270 and 280 shown at FIG. 2.

Figure 6:
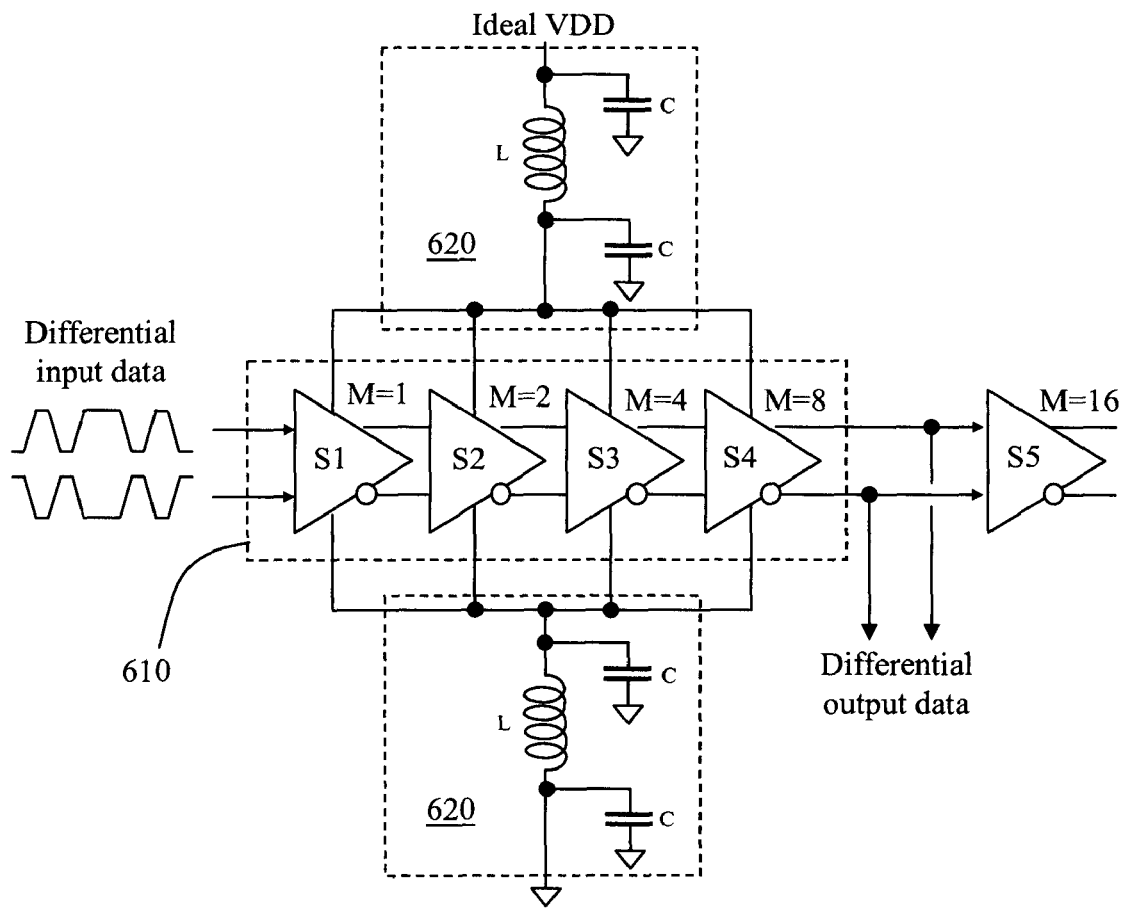
FIG. 6 is an exemplary four-stage buffer amplifier for simulation.

An exemplary simulation is conducted by using TSMC 0.18 μm Mixed Signal SALICIDE (1P6M, 1.8V/3.3V), version 1.3 to compare the operating bandwidth of four stages of buffer circuits consistent with the present invention with that of a four-stage buffer amplifier using the buffer circuit of FIG. 1B. The purpose of this exemplary simulation is to determine the optimal bandwidth by real-time jitter analysis with the input data transmission rate changing from 2 Gbps to 7 Gps. The simulated circuit is a four-stage buffer amplifier as shown at FIG. 6. The four-stage buffer amplifier includes four sets of buffer circuits, S1, S2, S3 and S4. The parallel connection numbers corresponding to buffer circuits S1, S2, S3 and S4 are 1, 2, 4 and 8. In other words, there are two buffer circuits of S1 connected in parallel to form buffer circuit S2. Four buffer circuits of S1 connected in parallel form buffer circuit S2 while eight buffer circuits of S1 connected in parallel to form buffer circuit S4. The first test circuit 610 uses the buffer circuit of FIG. 2 as buffer circuit S1, wherein the parallel connection numbers for inverters 210 and 220 are four, the parallel connection numbers for inverters 250 and 260 are 2 and the parallel connection numbers for inverters 230 and 240 and transmission gates 270 and 280. The second test circuit 610 uses buffer circuits of prior art FIG. 1B as buffer circuit S1. With respect to parameter setting, the transition time is set as 100 ps, the high voltage is set as 1.8 V and the low voltage is 0 V. There is a load circuit connected to the output of the simulated circuit. The configuration of the load circuit is identical to that of the four-stage buffers and the size of it is as twice as the last stage buffer circuit. The size of the transistors is set forth in Table 1 below.

TABLE 1

| | W/L |
|---|---|
| NMOS Transistor | 1.87μ/0.18μ |
| PMOS Transistor | 0.45μ/0.18μ |

In order to simulate non-ideal environment, the simulated circuit also includes equivalent circuit models of packaging 620 as shown at FIG. 6. The inductance is 2 nH and the capacitance is 1 pF.

Figure 7:
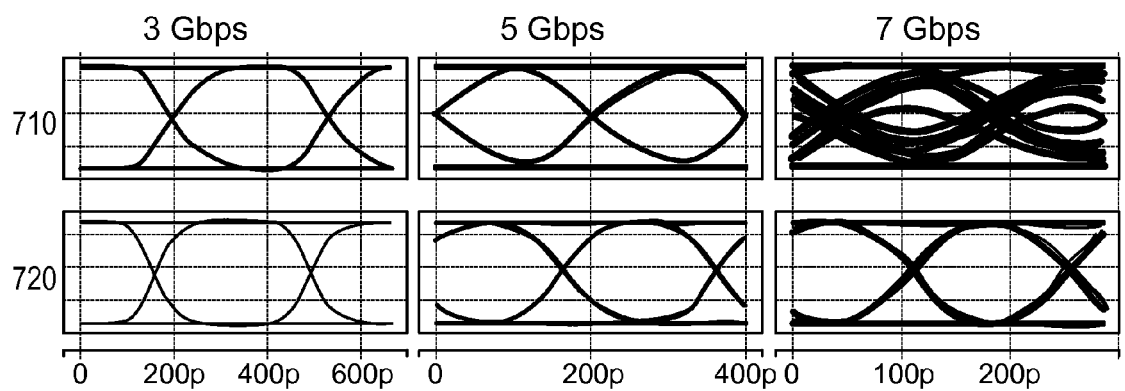
FIG. 7 shows the experimental results in an exemplary implementation.
Figure 8:
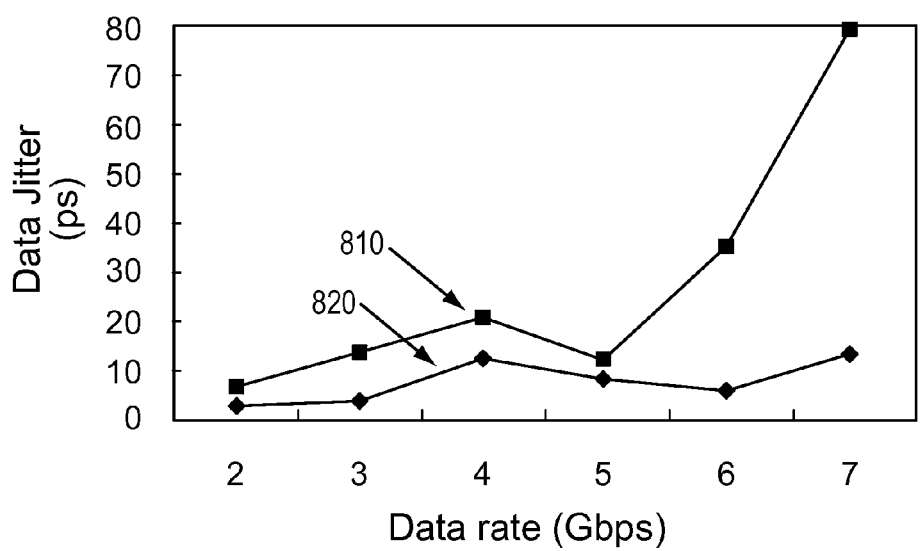
FIG. 8 shows the experimental results in an exemplary implementation.

FIG. 7 shows the results of the exemplary simulation of FIG. 6. The second row 720 has diagrams of output signals of a four-stage buffer amplifier using four buffer circuits consistent with the present invention with input data transmission rate at 3 Gbps, 5 Gbps, and 7 Gbps. In comparison, the first row 710 has diagrams of output signals of a four-stage buffer amplifier the buffer circuit illustrated FIG. 1B. Referring to FIG. 7, diagrams in row 720 show less real-time jitter than corresponding diagrams in row 610. FIG. 8 is a line chart comparing the data jitter results 810 of a four-stage buffer amplifier using the buffer circuit of FIG. 1B with those results 820 of a four-stage buffer amplifier using a buffer circuit consistent with the present invention. Table 2 below illustrates the data jitter results corresponding to the results shown at FIG. 8.

TABLE 2

|  | 2 Gbps | 3 Gbps | 4 Gbps | 5 Gbps | 6 Gbps | 7 Gbps |
| --- | --- | --- | --- | --- | --- | --- |
| 810 | 6.72 p | 13.6 p | 21 p | 12.2 p | 35.6 p | 80 p |
| 820 | 3 p | 4 p | 12.9 p | 8.9 p | 6.4 p | 14.2 p |

It will be appreciated by those skilled in the art that changes could be made to the examples described above without departing from the broad inventive concept thereof It is understood, therefore, that this invention is not limited to the particular examples disclosed, but it is intended to cover modifications within the spirit and scope of the present invention as defined by the appended claims.

We claim:

1. A buffer circuit including at least one buffer interface stage, the buffer interface stage comprising:
a first inverter having an input node coupled to first input terminal of the buffer circuit and an output node coupled to an output terminal of the buffer circuit;
a second inverter having an input node coupled to a second input terminal of the buffer circuit and an output node;
a third inverter having an input node coupled to the output terminal and an output node coupled to the output node of the second inverter;
a fourth inverter having an input node coupled to the output node of the second inverter and an output node coupled to the output terminal;
a fifth inverter having an input node and an output node coupled to the output terminal;
a first resistive element coupled between the output terminal and the input node of the fifth inverter;
a sixth inverter having an input node and an output node coupled to the output node of the second inverter; and
a second resistive element coupled between the output node of the second inverter and the input node of the sixth inverter.

2. The buffer circuit of claim 1, wherein the second input terminal comprises one of a reference voltage and a complementary input of the first input terminal.

3. The buffer circuit of claim 1, wherein at least one inverter of the first, second, third, fourth, fifth, and sixth inverters comprises:
a PMOS transistor having a source coupled to a first supply voltage, a gate coupled to the input node of the inverter, and a drain coupled to the output node of the inverter; and
an NMOS transistor having a source coupled to a second supply voltage, a gate coupled to the input node of the inverter, and a drain coupled to the output node of the inverter.

4. The buffer circuit of claim 1, wherein at least one inverter of the first, second, third, fourth, fifth, and sixth inverters comprises:
a PMOS transistor having a source coupled to a first supply voltage, a gate coupled to the reference voltage, and a drain coupled to the output node of the inverter; and
an NMOS transistor having a source coupled to a second supply voltage, a gate coupled to the input node of the inverter, and a drain coupled to the output node of the inverter.

5. The buffer circuit of claim 1, wherein at least one inverter of the first, second, third, fourth, fifth, and sixth inverters comprises:
a PMOS transistor having a source coupled to a first supply voltage, a gate coupled to the input node of the inverter, and a drain coupled to the output node of the inverter; and
an NMOS transistor having a source coupled to a second supply voltage, a gate coupled to the reference voltage, and a drain coupled to the output node of the inverter.

6. The buffer circuit of claim 1, wherein at least one inverter of the first, second, third, fourth, fifth, and sixth inverters comprises:
a resistive element coupled between a first supply voltage and the output node of the inverter; and
a transistor having a source coupled to a second supply voltage, a gate coupled to the input node of the inverter and a drain coupled to the output node of the inverter.

7. The buffer circuit of claim 1, wherein at least one of the first and second resistive elements comprises at least one of a transmission gate, a resistor, and a transistor.

8. A buffer circuit comprising at least one buffer interface stage, the buffer interface stage comprising:
a first inverter having an input node coupled to a first input terminal and an output node coupled to a first output terminal;
a second inverter having an input node coupled to a second input terminal and an output node coupled to a second output terminal;
a third inverter having an input node coupled to the first output terminal and an output node coupled to the second output terminal;
a fourth inverter having an input node coupled to the second output terminal and an output node coupled to the first output terminal;
a fifth inverter having an input node and an output node coupled to the first output terminal;
a first transmission gate coupled between the first output terminal and the input node of the fifth inverter;
a sixth inverter having an input node and an output node coupled to the second output terminal; and
a second transmission gate coupled between the second output terminal and the input node of the sixth inverter.

9. The buffer circuit of claim 8, wherein at least one inverter of the first, second, third, fourth, fifth, and sixth inverters comprises:
a PMOS transistor having a source coupled to a first supply voltage, a gate coupled to the input node of the inverter, and a drain coupled to the output node of the inverter; and an NMOS transistor having a source coupled to a second supply voltage, a gate coupled to the input node of the inverter, and a drain coupled to the output node of the inverter.

10. The buffer circuit of claim 8, wherein at least one inverter of the first, second, third, fourth, fifth, and sixth inverters comprises:
  a PMOS transistor having a source coupled to a first supply voltage, a gate coupled to the reference voltage, and a drain coupled to the output node of the inverter; and
  an NMOS transistor having a source coupled to a second supply voltage, a gate coupled to the input node of the inverter, and a drain coupled to the output node of the inverter.

11. The buffer circuit of claim 8, wherein at least one inverter of the first, second, third, fourth, fifth, and sixth inverters comprises:
  a PMOS transistor having a source coupled to a first supply voltage, a gate coupled to the input node of the inverter, and a drain coupled to the output node of the inverter; and
  an NMOS transistor having a source coupled to a second supply voltage, a gate coupled to the reference voltage, and a drain coupled to the output node of the inverter.

12. The buffer circuit of claim 8, wherein at least one inverter of the first, second, third, fourth, fifth and sixth inverters comprises:
  a resistive element coupled between a first supply voltage and the output node of the inverter; and
  a transistor having a source coupled to a second supply voltage, a gate coupled to the input node of the inverter and a drain coupled to the output node of the inverter.

13. A buffer circuit including at least one buffer interface stage, the buffer interface stage comprising:
  a differential pair configured to receive input signals of the buffer interface stage and generate amplified signals from the input signals, the differential pair comprises;
    a first inverter having an input node coupled to a first input terminal and an output node coupled to an output terminal of the buffer circuit; and
    a second inverter having an input node coupled to a second input terminal;
  a noise reduction circuit coupled to the differential pair, the noise reduction circuit configured to filter noises in the input signals, the noise reduction circuit comprises;
    a third inverter having an input node coupled to the first output terminal and an output node coupled to the output node of the second inverter; and
    a fourth inverter having an input node coupled to the output node of the second inverter and an output node coupled to the first output terminal;
  a bandwidth control circuit coupled to the differential pair and the noise reduction circuit, the bandwidth control circuit configured to control bandwidth distributions of the amplified signals, the bandwidth control circuit comprises;
    a fifth inverter having an input node and an output node coupled to the first output terminal;
    a first resistive element coupled between the output terminal and the input node of the fifth inverter;
    a sixth inverter having an input node and an output node coupled to the output node of the second inverter; and
    a second resistive element coupled between the output node of the second inverter and the input node of the sixth inverter.

14. The buffer circuit of claim 13, wherein the second input terminal comprises one of a reference voltage and a complementary input of the first input terminal.

15. The buffer circuit of claim 13, wherein at least one of the first and second resistive elements comprises at least one of a transmission gate, a resistor, and a transistor.

16. A method of operating a buffer circuit with at least one buffer interface stage, comprising:
  providing input signals to a differential pair comprising:
    a first inverter having an input node coupled to a first input terminal and an output node coupled to an output terminal of the buffer circuit and;
    a second inverter having an input node coupled to a second input terminal;
  generating amplified signals from the input signals by the differential pair;
  filtering noises in the input signals by a noise reduction circuit comprising:
    a third inverter having an input node coupled to the first output terminal and an output node coupled to the output node of the second inverter; and
    a fourth inverter having an input node coupled to the output node of the second inverter and the output node coupled to the first output terminal; and
  controlling bandwidth distributions of the amplified signals by a bandwidth control circuit comprising;
    a fifth inverter having an input node and an output node coupled to the first output terminal;
    a first resistive element coupled between the output terminal and the input node of the fifth inverter;
    a sixth inverter having an input node and an output node coupled to the output node of the second inverter; and
    a second resistive element coupled between the output node of the second inverter and the input node of the sixth inverter.

17. The buffer circuit of claim 1, wherein the input node of the fifth inverter and the input node of the sixth inverter are not coupled to each other.

18. The buffer circuit of claim 8, wherein the input node of the fifth inverter and the input node of the sixth inverter are not coupled to each other.

19. The buffer circuit of claim 13, wherein the input node of the fifth inverter and the input node of the sixth inverter are not coupled to each other.

20. The method of claim 16, wherein the input node of the fifth inverter and the input node of the sixth inverter are not coupled to each other.

21. The buffer circuit of claim 1, wherein the first resistive element and the second resistive element are not coupled to each other.

22. The buffer circuit of claim 8, wherein the first transmission gate and the second transmission gate are not coupled to each other.

23. The buffer circuit of claim 13, wherein the first resistive element and the second resistive element are not coupled to each other.

24. The method of claim 16, wherein the first resistive element and the second resistive element are not coupled to each other.

* * * * *